(12) United States Patent
Wang

(10) Patent No.: US 12,237,397 B2
(45) Date of Patent: *Feb. 25, 2025

(54) PARTIAL DIRECTIONAL ETCH METHOD AND RESULTING STRUCTURES

(71) Applicant: Taiwan Semiconductor Manufacturing Co., Ltd., Hsinchu (TW)

(72) Inventor: Shiang-Bau Wang, Pingzchen (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/343,555

(22) Filed: Jun. 28, 2023

(65) Prior Publication Data

US 2023/0343853 A1 Oct. 26, 2023

Related U.S. Application Data

(63) Continuation of application No. 17/809,055, filed on Jun. 27, 2022, now Pat. No. 11,728,407, which is a continuation of application No. 17/026,012, filed on Sep. 18, 2020, now Pat. No. 11,374,110.

(60) Provisional application No. 62/981,838, filed on Feb. 26, 2020.

(51) Int. Cl.
*H01L 29/66* (2006.01)
*H01L 27/088* (2006.01)
*H01L 29/78* (2006.01)

(52) U.S. Cl.
CPC .... *H01L 29/66545* (2013.01); *H01L 27/0886* (2013.01); *H01L 29/66795* (2013.01); *H01L 29/7851* (2013.01)

(58) Field of Classification Search
CPC ....... H01L 21/28141; H01L 21/823431; H01L 21/823821; H01L 21/845; H01L 27/0886; H01L 27/0924; H01L 27/1211; H01L 29/0653; H01L 29/41791; H01L 29/42392; H01L 29/66545; H01L 29/6653; H01L 29/66553; H01L 29/6656; H01L 29/66795; H01L 29/66871; H01L 29/785;
(Continued)

(56) References Cited

U.S. PATENT DOCUMENTS

| 6,383,884 | B1 | 5/2002 | Shiozawa et al. |
| 6,664,195 | B2 | 12/2003 | Jang et al. |
| 9,269,792 | B2 | 2/2016 | Cheng et al. |

(Continued)

FOREIGN PATENT DOCUMENTS

| CN | 104701376 A | 6/2015 |
| CN | 109427680 A | 3/2019 |

(Continued)

*Primary Examiner* — David C Spalla
(74) *Attorney, Agent, or Firm* — Slater Matsil, LLP

(57) ABSTRACT

In a gate replacement process, a dummy gate and adjacent structure, such as a source/drain region, are formed. The dummy gate is removed, at least in part, using a directional etch to remove some but not all of the dummy gate to form a trench. A portion of the dummy gate remains and protects the adjacent structure. A gate electrode can then be formed in the trench. A two step process can be employed, using an initial isotropic etch followed by the directional etch.

20 Claims, 12 Drawing Sheets

(58) Field of Classification Search
CPC ............. H01L 29/7851; H01L 29/7853; H01L 29/7855; H01L 2029/7858
See application file for complete search history.

(56) References Cited

U.S. PATENT DOCUMENTS

| | | |
|---|---|---|
| 10,651,311 B2 | 5/2020 | Fang et al. |
| 10,797,157 B1 | 10/2020 | Chuang et al. |
| 11,374,110 B2 * | 6/2022 | Wang .................. H01L 29/7851 |
| 11,728,407 B2 * | 8/2023 | Wang .................. H01L 29/7851 257/401 |
| 2008/0283897 A1 | 11/2008 | Ding et al. |
| 2015/0162403 A1 | 6/2015 | Oxland |
| 2016/0111543 A1 | 4/2016 | Fang et al. |
| 2017/0288032 A1 | 10/2017 | Lu et al. |
| 2018/0248005 A1 | 8/2018 | Lilak et al. |
| 2019/0067449 A1 | 2/2019 | Zhou |
| 2019/0103325 A1 | 4/2019 | Huang et al. |
| 2024/0096707 A1 | 3/2024 | Huang et al. |

FOREIGN PATENT DOCUMENTS

| | | |
|---|---|---|
| CN | 109585293 A | 4/2019 |
| JP | 2002184982 A | 6/2002 |
| KR | 1020160045575 A | 4/2016 |

\* cited by examiner

PARTIAL DIRECTIONAL ETCH METHOD AND RESULTING STRUCTURES

PRIORITY CLAIM

This application is a continuation of U.S. patent application Ser. No. 17/809,055, filed on Jun. 27, 2022, and entitled "Partial Directional Etch Method and Resulting Structures," which is a continuation of U.S. patent application Ser. No. 17/026,012, filed on Sep. 18, 2020, now U.S. Pat. No. 11,374,110 issued on Jun. 28, 2022, and entitled "Partial Directional Etch Method and Resulting Structures," which is a conversion of and claims priority to U.S. Provisional Patent Application No. 62/981,838, filed on Feb. 26, 2020, and entitled "Partial Directional Etch Method and Resulting Structures," which are incorporated herein by reference.

BACKGROUND

In manufacturing semiconductor devices, such as FinFETs or other transistors, a "gate last" process is typically employed in which a dummy gate structure is first formed and subsequently replaced with a metal gate. Damage to surrounding structures, such as source/drain regions, may occur during the etch process whereby the dummy structure is removed. Hence, a need exists for improved etch processes and the structures resulting therefrom.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
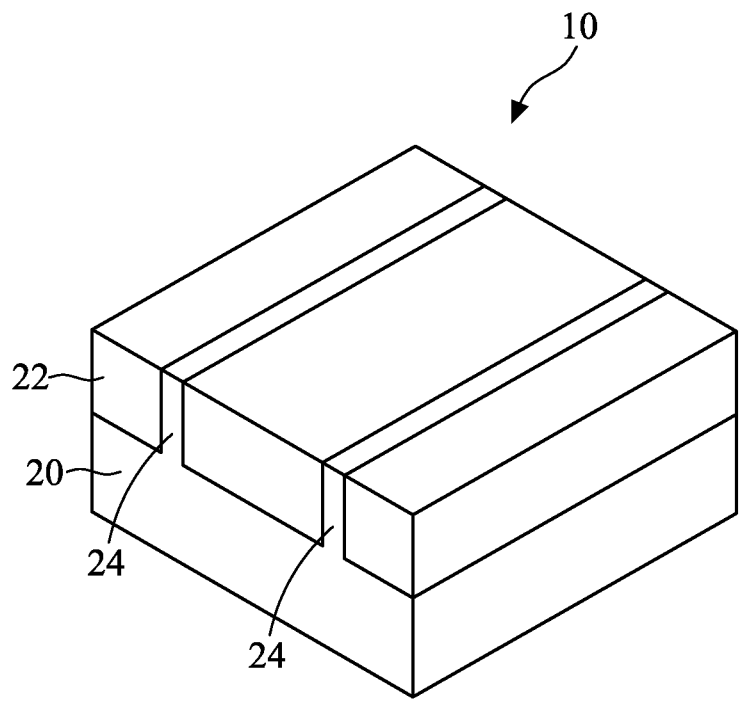
FIGS. 1, 2, 3A-3B, 4, 5A-5B, 6A-6D, 7A-7B, 8A-8D, and 9A-9B illustrates intermediate steps in an illustrative method of forming a device, such as a transistor, using a two step removal process to remove a dummy gate stack, and the resulting device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors formed using a replacement gate process and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Other multi-gate transistors, gate all around (GAA) transistors and, in some cases, planar transistors may also adopt the embodiments of the present disclosure.

FIGS. 1 through 9B illustrate cross-sectional views, perspective views, and plan views of intermediate stages in the formation of a semiconductor device, such as a FinFET transistor, in accordance with some embodiments of the present disclosure. The steps shown in FIGS. 1 through 9B are also reflected schematically in the process flow 200 as shown in FIG. 10.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some exemplary embodiments, semiconductor strips 24 are formed of silicon germanium, silicon carbon, or a III-V compound semiconductor material. Although only two semiconductor strips 24 are illustrated, embodiments in which numerous, perhaps even thousands or more of semiconductor strips 24 are formed on substrate 20. Further, it bears noting that the figures are not drawn to scale. Rather, some features are shown exaggerated in size, thickness, depth, etc. to allow for a more ready comprehension of the disclosed features.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
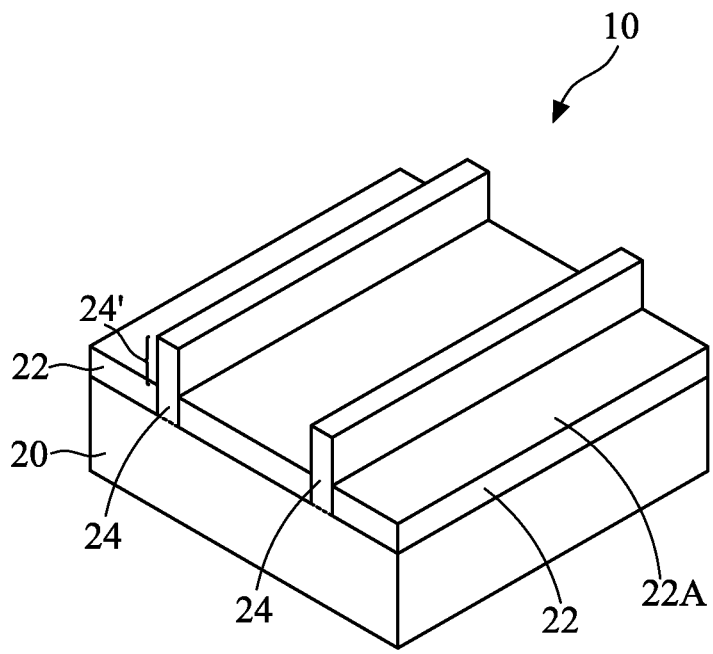

Referring to FIG. 2, STI regions 22 are recessed, so that the top portions of semiconductor strips 24 protrude higher than the top surfaces 22A of the remaining portions of STI regions 22 to form protruding fins 24'. The respective step is illustrated as step 202 in the process flow 200 as shown in FIG. 10. The etching may be performed using a dry etching process, wherein HF3 and NH3 are used as the etching gases. In accordance with alternative embodiments of the present disclosure, the recessing of STI regions 22 is performed using a wet etch process. The etching chemical may include HF solution, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 24' may also be replaced with materials different from that of substrate 20. For example, protruding fins 24' may be formed of Si, SiP, SiC, SiPC, SiGe, SiGeB, Ge, or a III-V compound semiconductor such as InP, GaAs, AlAs, InAs, InAlAs, InGaAs, or the like. It should be noted that not all fins on a substrate need be of the same size, shape, or material. As but one example, it is contemplated that certain fins will be used in manufacturing p-type transistors (or perhaps capacitors, diodes, or the like using p-type transistor structures), whereas other fins will be used in manufacturing n-type transistors (or perhaps capacitors, diodes, or the like using n-type transistor structures). Hence, the so-called p-type fins on a substrate may all be of the same material, for instance, but may be of a different material (or at least partially of a different material) relative to the so-called n-type fins. As but another example, some fins on the substrate, be they n-type or p-type, might differ from other fins in terms of the fin length or even the fin width. As will be apparent to one skilled in the art, when informed by the present disclosure, differences in fin width can result in differences in channel length of the resulting transistors formed on the respective fins.

Figure 3A:
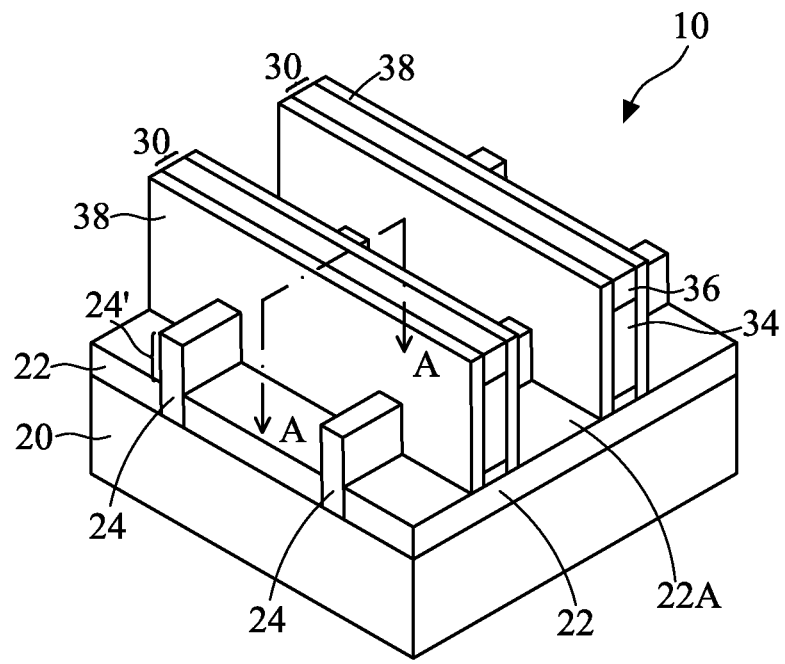

Referring to FIG. 3A, dummy gate stacks 30 are formed on the top surfaces and the sidewalls of (protruding) fins 24'. The respective step is illustrated as step 204 in the process flow 200 as shown in FIG. 10. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'. One skilled in the art will recognize that the dummy gate stack may be formed by blanket depositing one or more layers of the materials from which the dummy gate stack is formed and then, individually or collectively, patterning the layers using photolithographic and etching or other patterning techniques to form individual dummy gate stacks. In the illustrated embodiment, two dummy gate stacks each respectively extend over two adjacent fins. In practice, it is likely that numerous gate stacks will extend over numerous fins in some embodiments, although the specific number and arrangement and relationship between fins and gate stacks is essentially a matter of design choice that will be apparent through routine experimentation to one skilled in the art when informed by the present disclosure.

Next, gate spacers 38 are formed on the sidewalls of dummy gate stacks 30. In accordance with some embodiments of the present disclosure, gate spacers 38 are formed of a dielectric material such as silicon nitride, silicon oxide, silicon carbo-nitride, silicon oxynitride, silicon oxy carbonitride, or the like, and may have a single-layer structure or a multi-layer structure including a plurality of dielectric layers. Although only a single gate spacer is illustrated for simplicity, it is within the contemplated scope of this disclosure that two or more gate spacers could be used in forming a FinFET or similar type of transistor. Gate spacers can be employed for self-aligned removal of portions of the fin—as explained below. Gate spacer may also be employed, e.g., for self-aligned formation of Lightly Dope Drain (LDD) regions, pocket implants, halo implants, and the like.

Figure 3B:
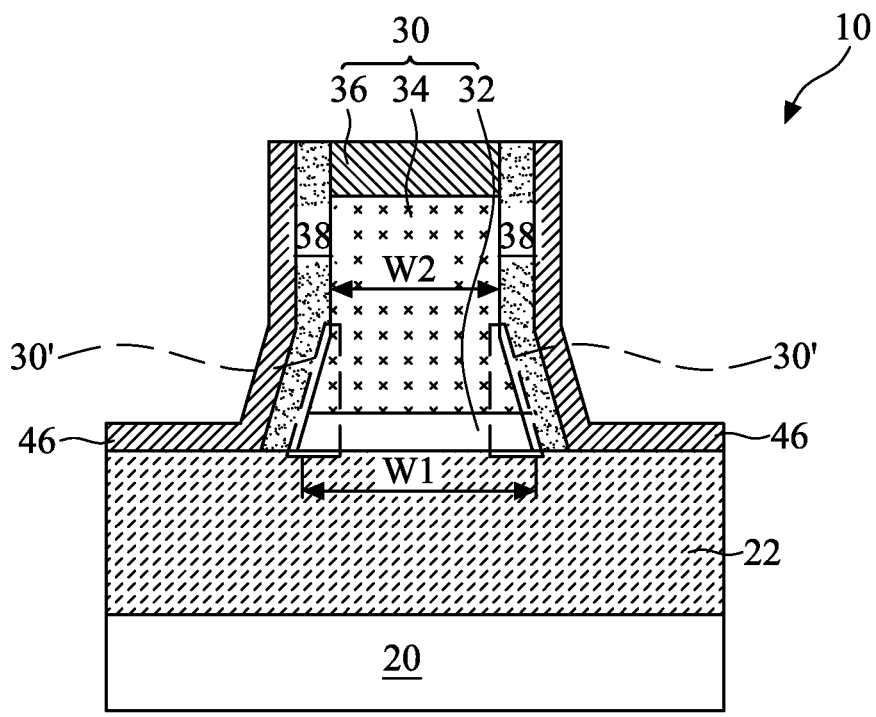

A cross-sectional view of the structure shown in FIG. 3A is illustrated in FIG. 3B. The cross-sectional view is obtained from the vertical plane containing line A-A in FIG. 3A. As shown in FIG. 3B, one of dummy gate stacks 30 is illustrated. Due to process reasons such as the etching effect in the patterning of dummy gate stack 30, the bottom portions of dummy gate stack 30 are wider than the respective upper portions. In addition, it is possible that dummy gate stack 30 includes an upper portion with straight and vertical sidewalls, and a lower portion with slanted, or tapered, sidewalls. The slanted sidewalls may also be straight, or may be substantially straight with a slight curve. The widening in the bottom portion of dummy gate stack 30 is referred to as footing effect, and the widening portions are referred to as footing regions (or portions), as marked by portions 30'. This footing phenomenon is particularly pronounced at the intersections or "corners" between the dummy gate stack and the STI layer upon which it is formed (adjacent the sidewall of the fin) and even more particularly pronounced at the intersection or "corner" between the dummy gate stack, the fin, and the STI layer. Footing portions 30' are overlapped by portions of gate spacers 38. In accordance with some embodiments of the present disclosure, the difference between bottom width W1 and the width W2 of the top portion (that has the vertical edges) of dummy gate stack 30 is greater than about 4 nm, and may be in the range between about 4 nm and about 12 nm. Gate spacers 38 may follow the profile of the sidewalls of dummy gate stack 30, and hence have footing portions as well.

Figure 4:
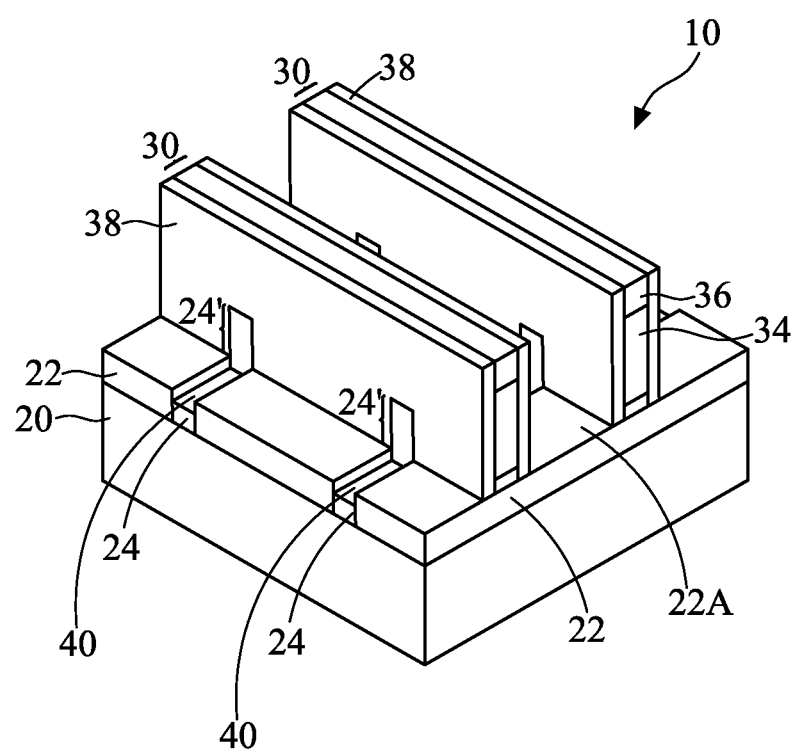

In accordance with some embodiments of the present disclosure, an etching step (referred to as source/drain recessing hereinafter) is performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
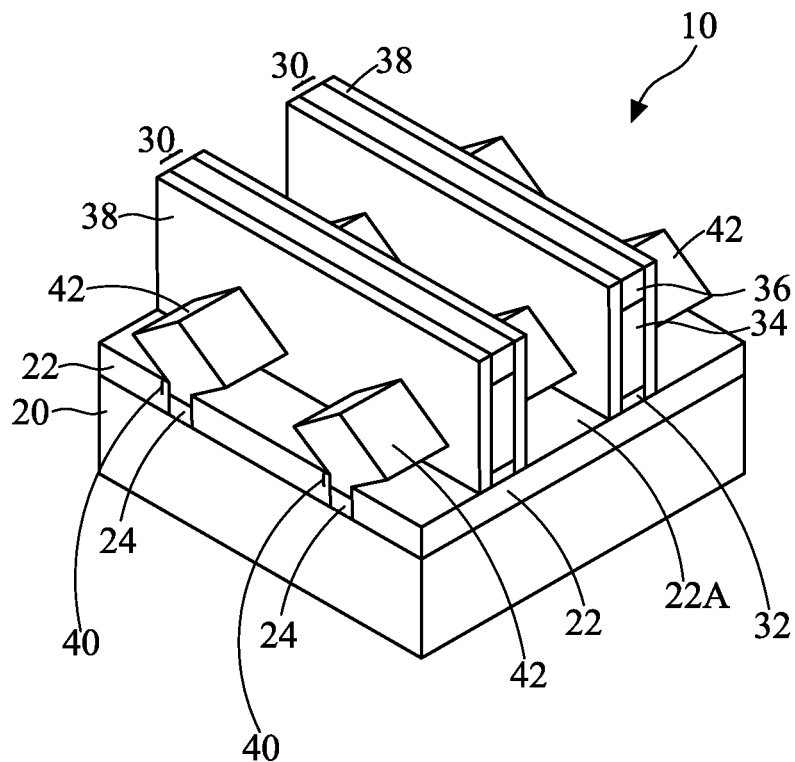

Next, epitaxy regions (source/drain regions) 42 are formed by selectively growing a semiconductor material in recesses 40, resulting in the structure in FIG. 5A. The respective step is illustrated as step 206 in the process flow 200 as shown in FIG. 10. In accordance with some exemplary embodiments, epitaxy regions 42 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed. In some embodiments, a series of epitaxial growth and etching processes may be performed to remove, alter, or otherwise shape the facet profiles. In some embodiments (not illustrated), adjacent epitaxy regions 42 on adjacent fins 24' may grow horizontally until they merge together.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy to form source/drain regions. Epitaxy source/drain regions 42 include lower portions that are formed in STI regions 22, and upper portions that are formed over the top surfaces of STI regions 22.

Figure 5B:
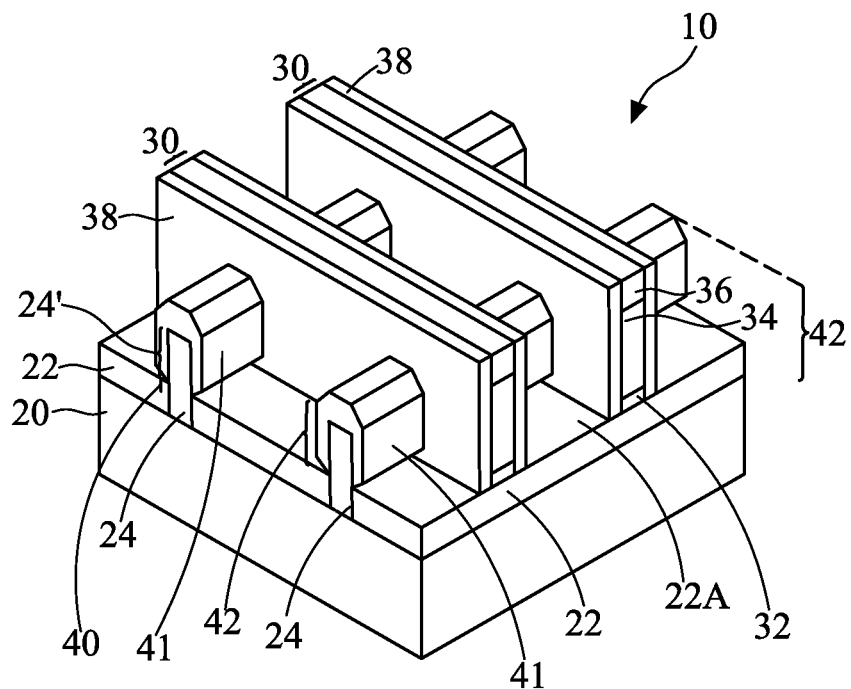

FIG. 5B illustrates the formation of cladding source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy regions 42 as shown in FIG. 5A, depending on whether the resulting FinFET is a p-type or an n-type FinFET. For instance, epitaxy regions 41 may include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 41 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 41 are grown on protruding fins 24', epitaxy regions 41 start expanding horizontally, and facets may be formed. In some embodiments, a series of epitaxial growth and etching processes may be to remove, alter, or otherwise shape the facet profiles. In some embodiments (not illustrated), adjacent epitaxy regions 41 on adjacent fins 24' may grow horizontally until they merge together. Accordingly, source/drains regions 42 include protruding fins 24' and the epitaxy region 41. An implantation may (or may not) be performed to implant an n-type impurity or a p-type impurity.

Figure 6A:
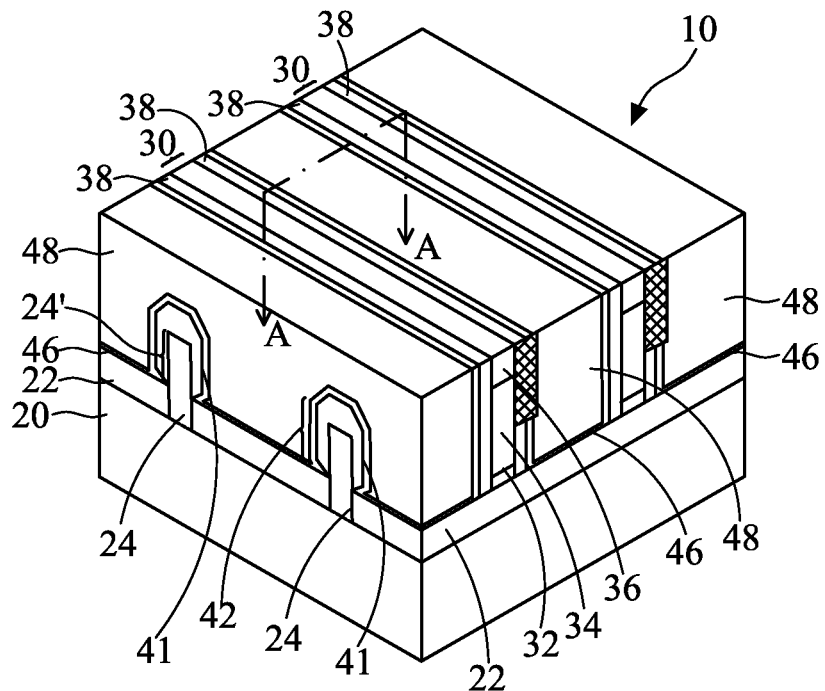

FIG. 6A illustrates a perspective view of the structure after the formation of Contact Etch Stop Layer (CESL) 46 and Inter-Layer Dielectric (ILD) 48. The respective step is illustrated as step 208 in the process flow 200 as shown in FIG. 10. CESL 46 may be formed of silicon nitride, silicon carbo-nitride, or the like. CESL 46 may be formed using a conformal deposition method such as ALD or CVD, for example. Although a single CESL layer is illustrated, it is within the contemplated scope of the present disclosure that two or more CESL layers, of the same or different respective thickness, and of the same or different respective materials, could be deposited or otherwise formed in lieu of the single CESL layer 46 illustrated in FIG. 6A. ILD 48 may include a dielectric material formed using, for example, FCVD, spin-on coating, CVD, or another deposition method. ILD 48 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. Likewise, as with CESL layer 46, ILD 48 may be embodied as two or more sub-layers that collectively form the ILD layer, which sub-layers can be of the same or different respective thicknesses, formed of the same or different materials, and formed using the same or different deposition techniques, processes, and/or parameters. A planarization step such as Chemical Mechanical Polish (CMP) or mechanical grinding is performed to level the top surfaces of ILD 48, dummy gate stacks 30, and gate spacers 38 with each other.

Figure 6B:
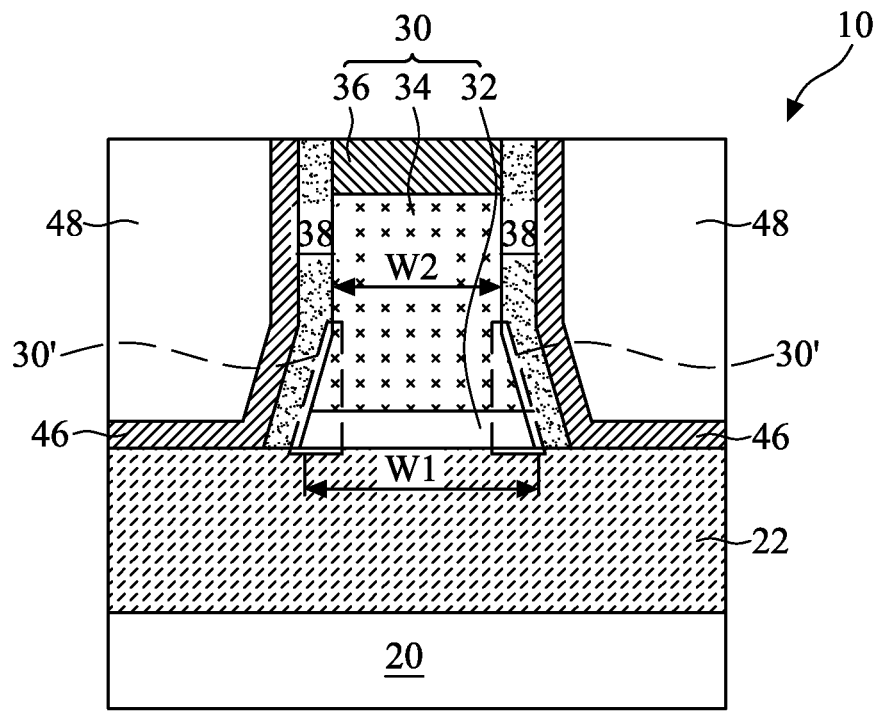

A cross-sectional view of the structure shown in FIG. 6A is illustrated in FIG. 6B. The cross-sectional view is obtained from the vertical plane containing line A-A in FIG. 6A. As shown in FIG. 6B, CESL 46, like spacers 38, follows the contours of dummy gate stacks 30 including the footing region 30' and hence CESL 46 also has a portion that widens outwards, much as does dummy stack 30.

Figure 6C:
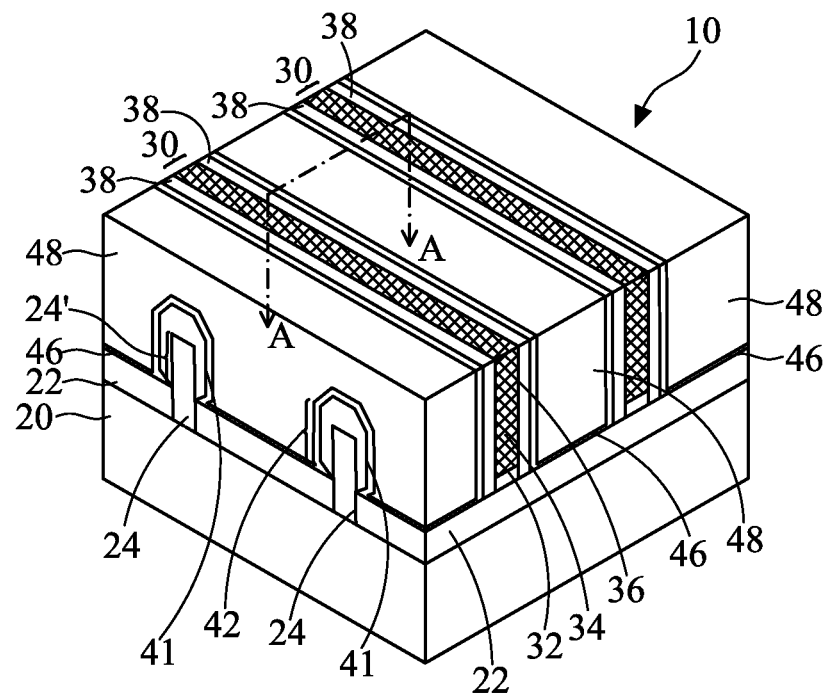
Figure 6D:
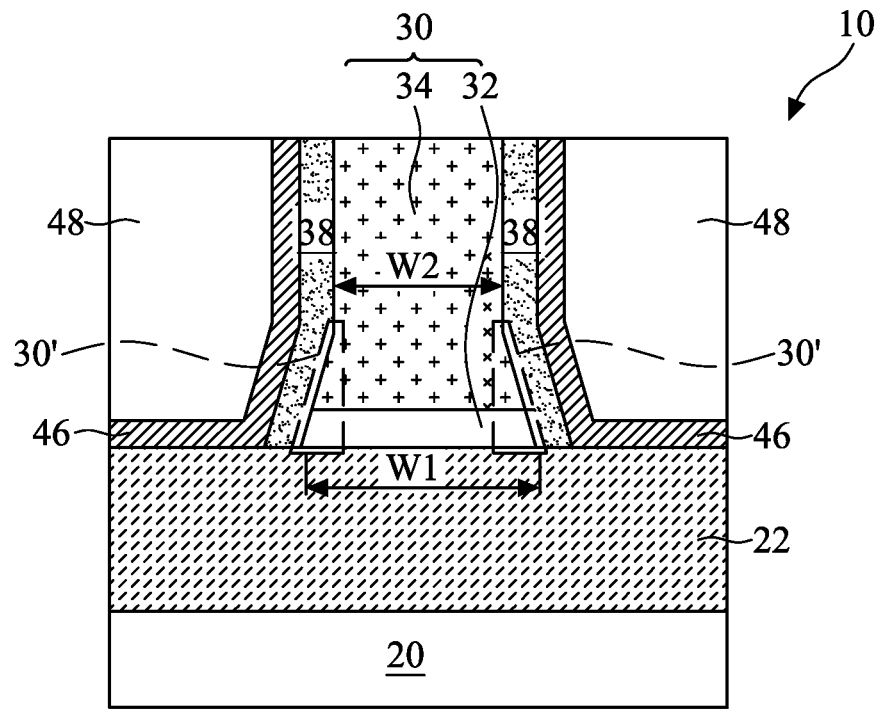

In some embodiments, hard mask 36 is not used, or else if used hard mask 36 is removed before formation of CESL 46 and ILD 48. Such an embodiment is illustrated in FIGS. 6C and 6D. As shown, in such embodiments, dummy gate electrode 34 is coplanar or at least substantially coplanar with the top surface of ILD 48 after the CMP or other planarization step. It should be recognized by one skilled in the art, as informed by the present disclosure, that the footing regions 30' are not specifically illustrated in FIGS. 6A and 6C and other perspective illustrations, but nonetheless are extant as illustrated by FIGS. 6B and 6D, and other cross-sectional illustrations.

Next, dummy gate stacks 30, which include hard mask layers 36, dummy gate electrodes 34 and dummy gate dielectrics 32, are removed and subsequently replaced with replacement gate stacks, which include metal gates and replacement gate dielectrics, as will be described below.

In a conventional process for removing dummy gate stack 30, an isotropic etch such as a wet etch, a remote plasma etch, or the like is used to completely remove dummy gate stack including hard mask 36, if any, and dummy gate electrodes 34. In some instances, dummy gate dielectric 32 may also be removed (etched) in the dummy gate stack removal process, whereas in some other instances, some or all of dummy gate dielectric may remain after removal of dummy gate stack 30. The inventors of this disclosure have recognized, however, that the dummy gate stack removal (etch) process can cause damage to adjacent structures such as source/drain regions 42. While the mechanics underlying this phenomena is not entirely understood, it is believed by the present inventors that the above-discussed footing regions of the dummy gate stack cause spacers 38 and CESL 46 to be damaged or compromised during the etching process. Such damage or compromise can allow for etchant/etching processes to attack adjacent structures such as the source/drain regions 42 and possibly fin 24'. It has been observed that in some cases damage such as partial removal, pitting, and the like can occur to the source/drain regions and/or fin regions, with near total or total removal of these structures in extreme cases.

Figure 7A:
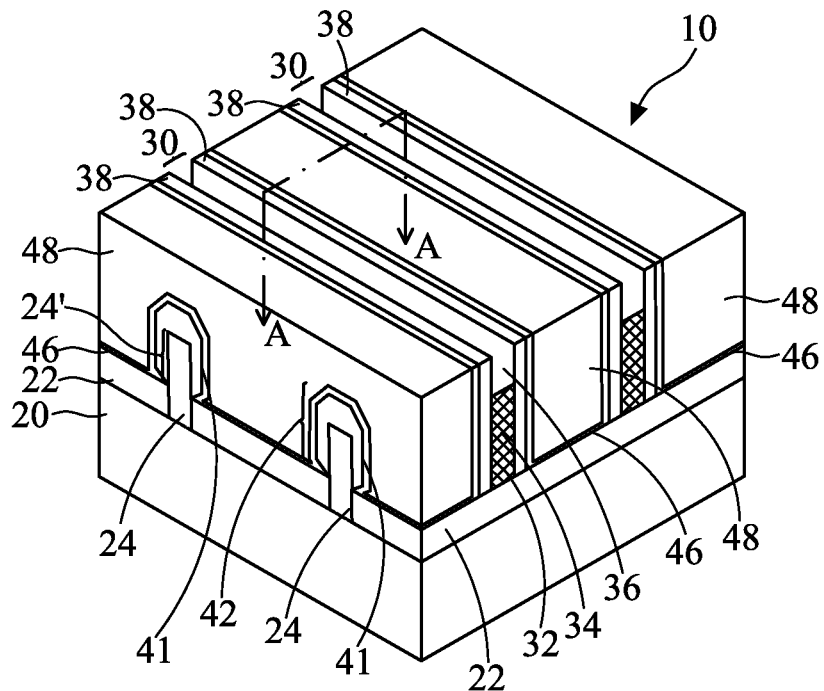
Figure 7B:
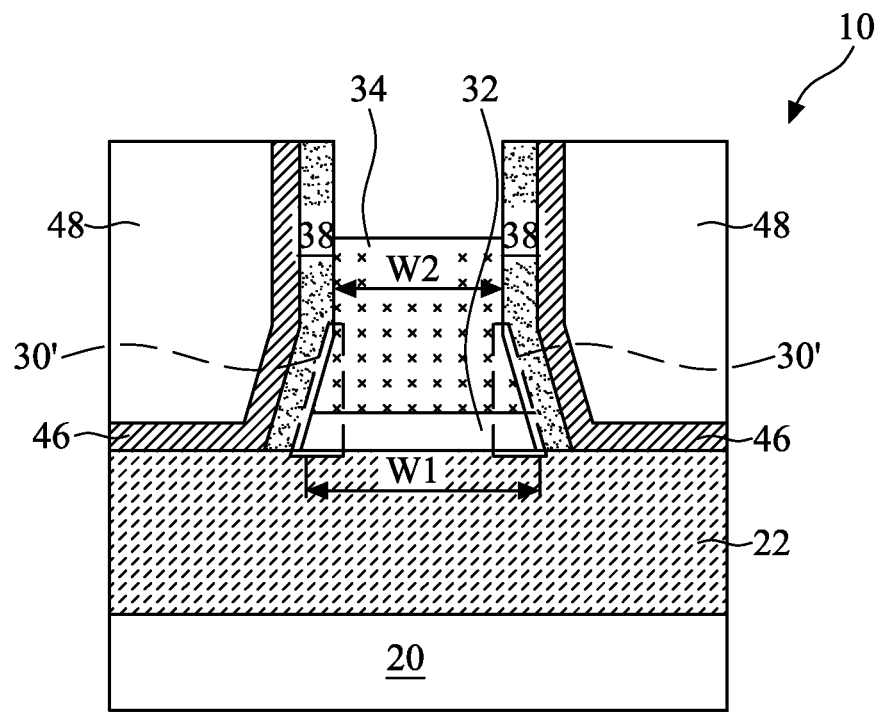

FIGS. 7A through 9B illustrate steps in a preferred embodiment that minimize or eliminate damage to adjacent structures during the dummy gate stack removal process. FIGS. 7A and 7B illustrate the results of a first partial etch of dummy gate stack 30, including hard mask 36 (if used) and an upper portion of dummy gate electrode 34. In the illustrated embodiments, the first partial etch of dummy gate stack 30 is an isotropic etch, i.e. an effectively non-directional etch. The respective step is illustrated as step 210 in the process flow 200 as shown in FIG. 10. In an embodiment, dummy gate stack is exposed to an appropriate wet or dry etch formulation, such as $NF_3/H_2/Ar/He$, or $NF_3/H_2/Ar/He$, $NF_3/CH_4/H_2/N_2/Ar/He$, or $NF_3/H_2/Ar/CH_4$, or $NF_3/H_2/Ar/CH_3F$, or the like. Other formulations and variations on the disclosed formulations will be apparent to those skilled in the art once informed by the present disclosure. Typical process parameters for the isotropic etch include a temperature of from about 10° C. to about 120° C., at atmospheric pressure, and for a period of time of from about 20 seconds to about 300 seconds.

It is contemplated that the first partial etch is a timed etch, timed to allow for the first partial etch process to proceed such that the top of the dummy gate stack 30 is etched down to a level that is approximately level with the top of fin 24'. This is a convenient reference point, and in fact may allow for end-point detection rather than a timed etch, but is not essential to the described embodiments. In fact, the first partial etch process could cease when the top of dummy gate stack 30 is above the level of fin 24' or below the level of fin 24' in other embodiments. Regardless of the relationship to the top of fin 24', preferably the first partial etch/isotropic etch ceases before the level of footing region 30' is reached.

Figure 8A:
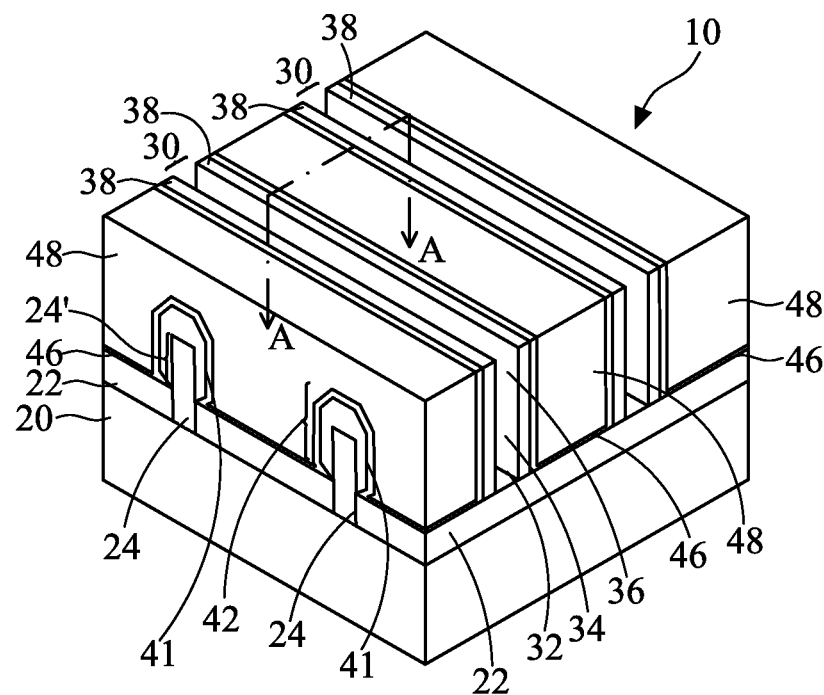
Figure 8B:
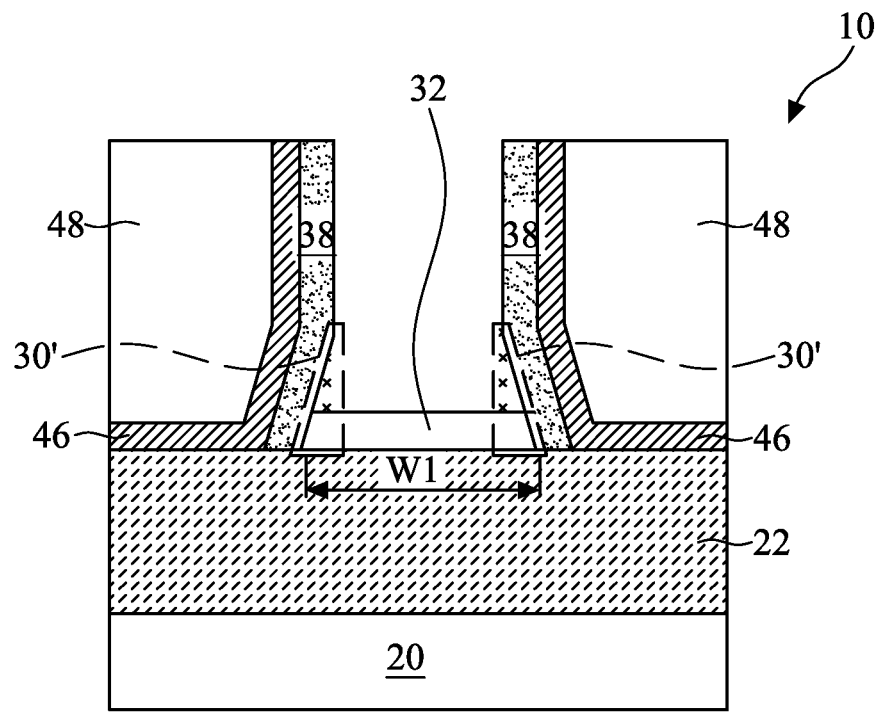

Next, a second partial etch process is employed for further remove dummy gate stack 30. The respective step is illustrated as step 212 in the process flow 200 as shown in FIG. 10. This second partial etch process is an anisotropic etch process, also sometimes referred herein as a directional etch process, such as a plasma etch with ion bombardment. Advantageously, the directional etch removes dummy gate stack material in a vertical direction much more quickly than it does in the horizontal direction. As a result, remnant portions of dummy gate stack material remain, particularly in the footing regions 30'—which tend to extend horizontally out relative to the overlying portions of dummy gate stack 30. These remnant portions are illustrated in FIG. 8B. While a directional etch provides advantageous results, as described herein, performing solely a directional etch to remove the entire dummy gate stack 30 could give rise to other disadvantages. For example, directional etching typically involves ion bombardment and polymer formation for sidewall passivation protection. The physical force of ion bombardment can cause undesirable gate height loss or corner loss. Likewise, the polymer formation can result in incomplete poly silicon removal. Hence, it is desirable to have a two etch process, with an isotropic etch removing a portion of the dummy gate stack, while the anisotropic etch removes (most or all) of the remainder.

As illustrated in FIG. 8B, the remnant portion of dummy gate stack material, which is typically polysilicon, that remains after the second partial etch may be substantially co-extensive with footing regions 30' of dummy gate stack 30. This is not a requirement, however, and—depending upon the etch chemistry and etch conditions—the remnant portions of polysilicon (or other dummy gate stack material) that remains could be more or less than footing regions 30'. This is best illustrated by FIGS. 8C and 8D, which are plan views (also known as top-down views) of the structure shown in FIG. 8B (in other words, only one fin 24' is illustrated in FIGS. 8C and 8D).

Figure 8C:
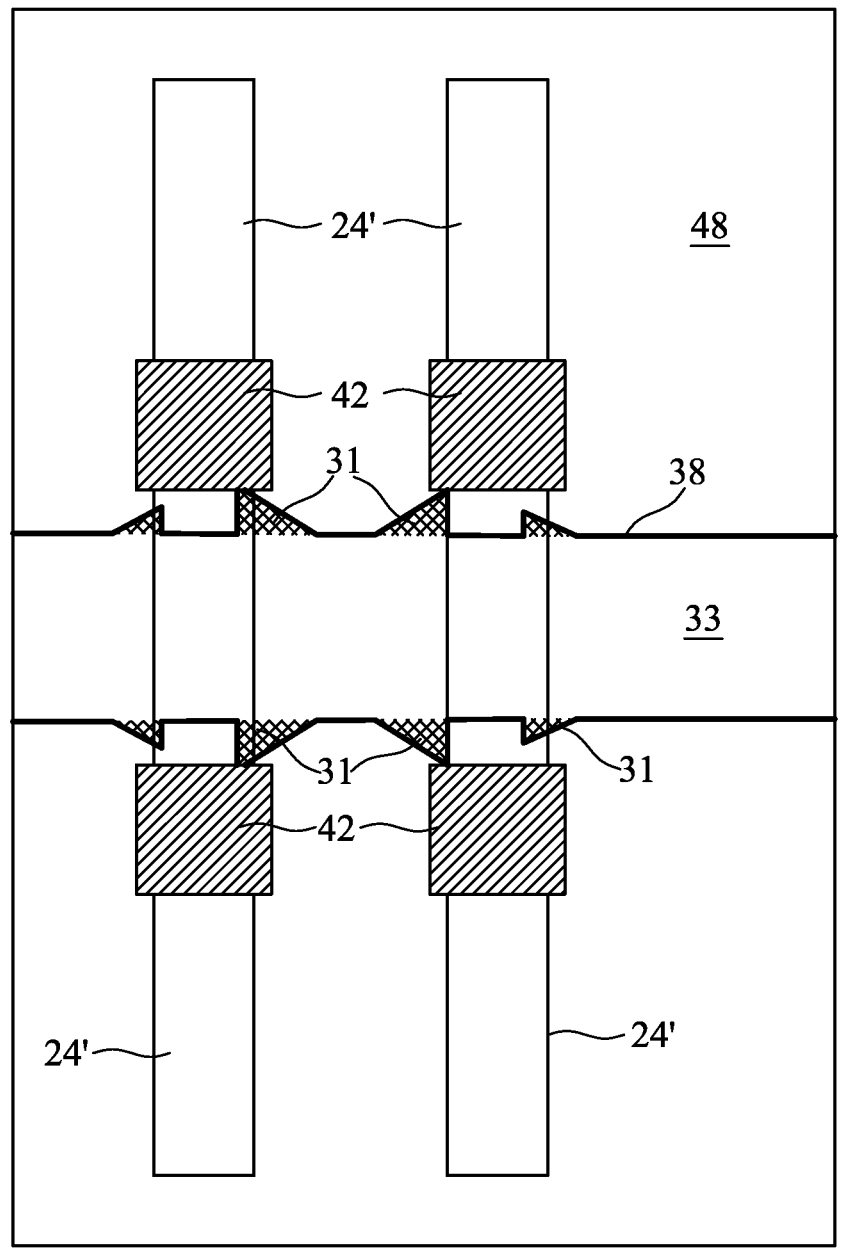
Figure 8D:
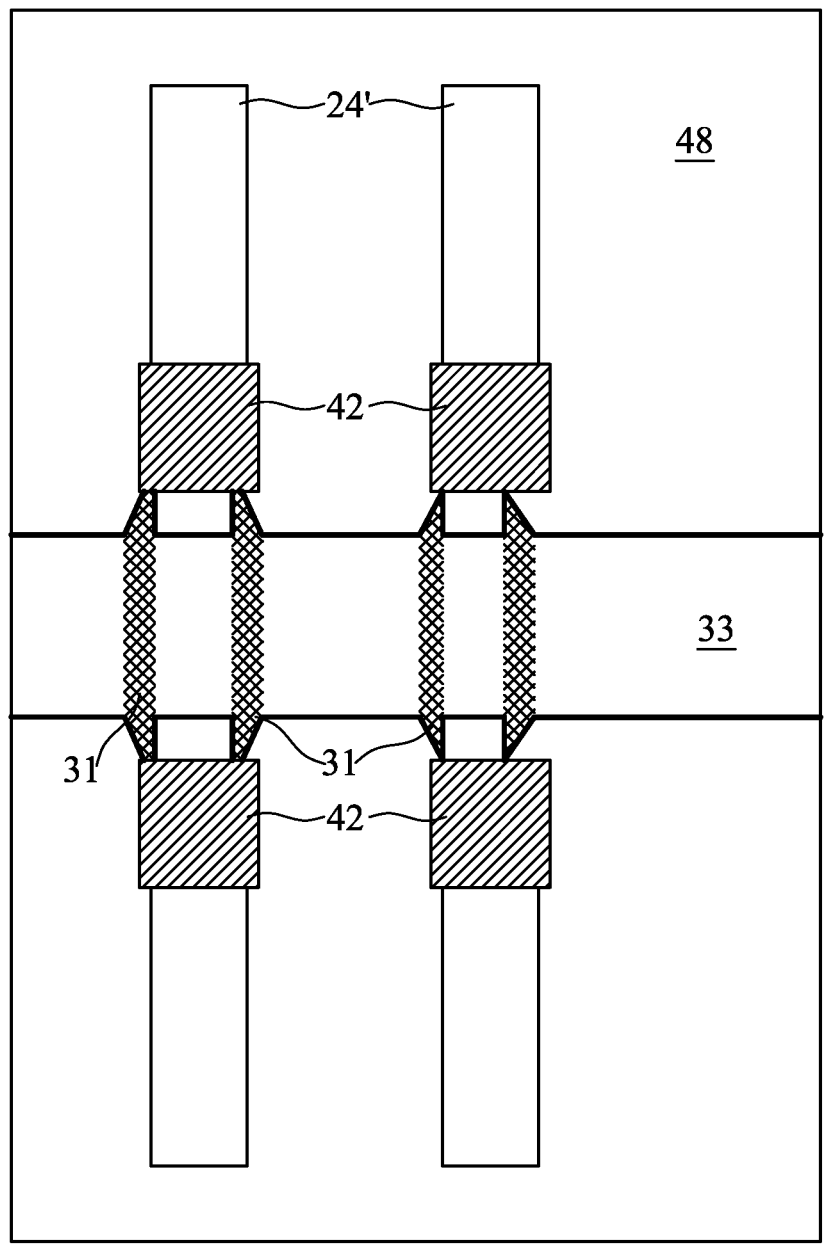

In the embodiment illustrated in FIG. 8C, the second partial etch continues until almost all dummy gate stack material is removed, leaving only remnant material 31 in corner regions where, because of the footing effects, dummy gate stack 30 expanded laterally outside the lateral dimensions of the gate stack. Because the second partial etch is a directional etch, these remnant portions will remain after most of dummy gate stack material, particularly dummy gate electrode 34, has been removed. By contrast, in FIG. 8D, more remnant material 31 remains in the trench 33, specifically at the bottom of trench 33. This is because, for instance, the second partial etch process of the embodiment of FIG. 8D does not proceed for as long as the etch process illustrated in FIG. 8C, even though the same etch process parameters (other than duration) may have been employed in both embodiments. In the embodiment shown in FIG. 8D, remnant dummy gate stack material, such as polysilicon or the like, extends across the bottom of trench 33 from one sidewall to the opposite sidewall of trench 33. In some embodiments, remnant material might not extend all the way across the trench, or at least might not do so in a continuous layer.

While the mechanics are not fully understood, it is believed by the present inventors that remnant material 31 acts to protect adjacent structures such as the source/drain regions 42 and the fin 24' from being attacked or damaged by the etchant chemistry during the dummy gate removal process. In this way, device performance and reliability is enhanced.

In an illustrative embodiment, the directional or anisotropic etch is a plasma etch wherein ion bombardment arising from a substrate self-bias of perhaps about 200V or less is employed. An etchant gas selected from $Cl_2$, $F_2$, or CxFy is employed along with a passivation gas such as $O_2$, $CO_2$, $SO_2$, HBr, $SiCl_4$, $CH_4$, $CH_3F$, and the like, and a dilute or carrier gas such as a noble gas (Ar, He, $N_2$, and the like). As an example, a gas chemistry of $NF_3$ is used, at a flow rate of from about 5 sccm to about 100 sccm and a temperature ranging from about 10° C. to about 120° C., under a pressure of from about 20 mTorr to about 2 Torr, for a period ranging from about 10 seconds about 300 seconds.

In the above illustrated embodiments, dummy gate stack dielectric 32 remains after the rest of dummy gate stack 30 has been removed (except for remnant portions 31). In other embodiments, dummy gate stack dielectric may be removed during the dummy gate stack removal process, or in other embodiments, dummy gate stack dielectric 32 may be removed in a subsequent etch process after dummy gate electrode 34 has been substantially removed (again save for remnant portions 31 that remain after the two step removal process). In yet other embodiments, dummy gate dielectric layer 32 might remain and be incorporated into a final device, such as a transistor, either alone or in combination with a subsequently formed high-k or other gate dielectric layer that is compatible with metal gates and the like.

Figure 9A:
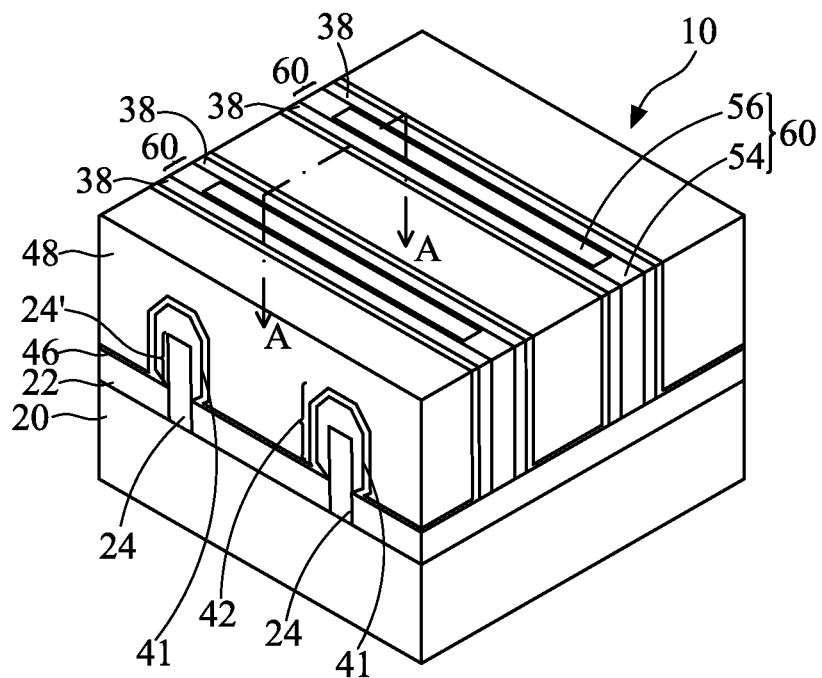
Figure 9B:
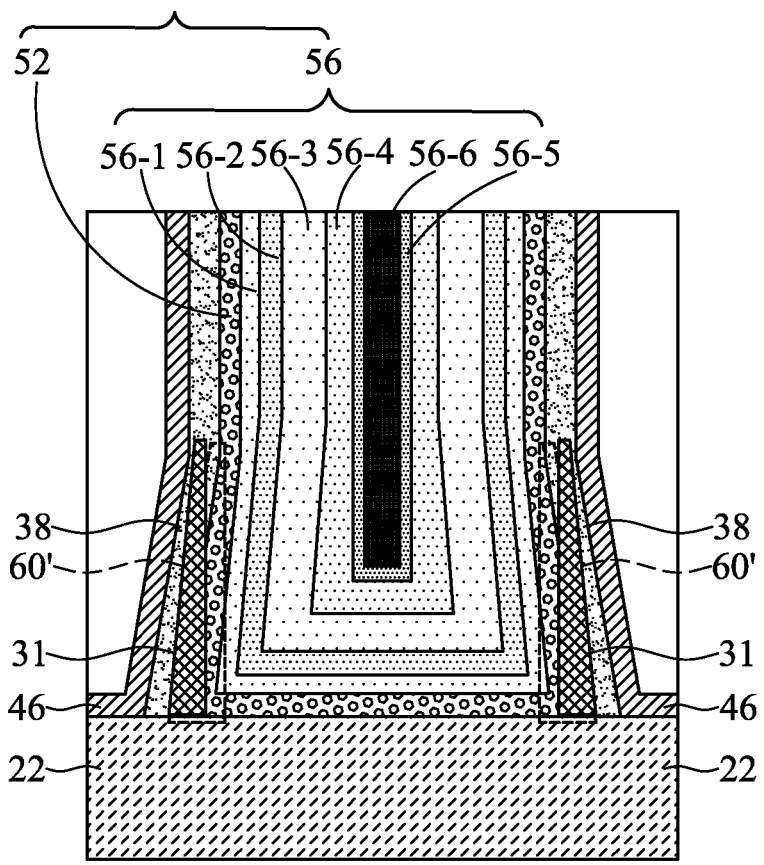
Figure 10:
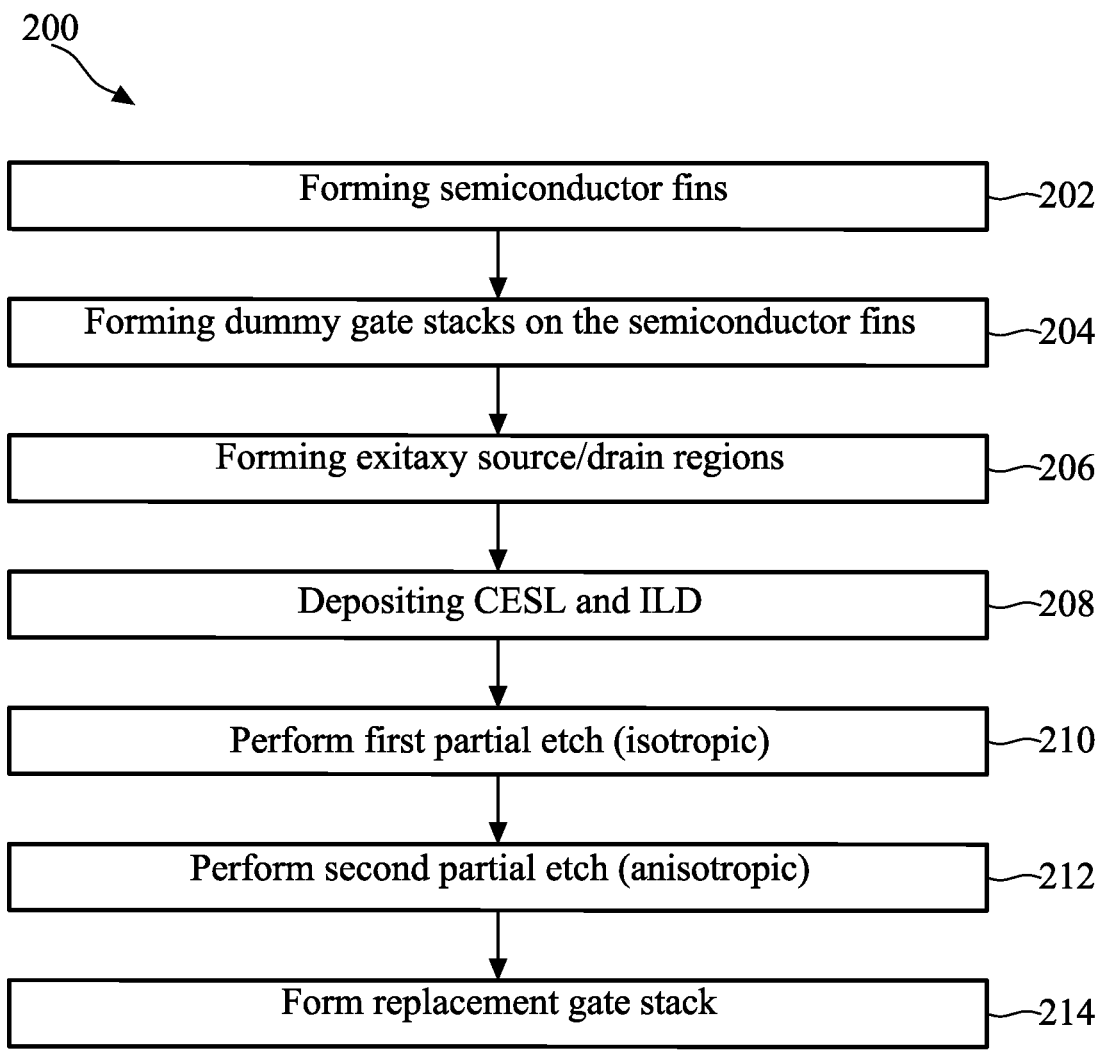
FIG. 10 is a flowchart illustrating relevant steps in an illustrative method as disclosed herein.

Next, referring to FIGS. 9A and 9B, (replacement) gate stacks 60 are formed, which include gate dielectric layers 54 and gate electrode 56. The respective step is illustrated as step 214 in the process flow 200 as shown in FIG. 10. In this embodiment, dummy gate dielectric layer 32 has been removed prior to forming gate stack 60. The formation of gate stacks 60 includes forming/depositing a plurality of layers, and then performing a planarization process such as a CMP process or a mechanical grinding process. Gate dielectric layers 54 extend into the trenches 33 left by the removed dummy gate stacks. In accordance with some embodiments of the present disclosure, gate dielectric layers 54 may include an Interfacial Layer (IL) as its lower part. IL 50 is formed on the exposed surfaces of protruding fins 24'. IL 50 may include an oxide layer such as a silicon oxide layer, which is formed through the thermal oxidation of protruding fins 24', a chemical oxidation process, or a deposition process. Gate dielectric layer 54 may also include high-k dielectric layer 52 (FIGS. 8B and 8C) formed over IL 50. High-k dielectric layer 52 includes a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is preferably higher than 3.9, and may be higher than about 7.0. High-k dielectric layer 52 is formed as a conformal layer, and extends on the sidewalls of protruding fins 24' and the sidewalls of gate spacers 38. In accordance with some embodiments of the present disclosure, high-k dielectric layer 52 is formed using ALD or CVD.

Referring back to FIGS. 9A and 9B, gate electrodes 56 are formed on top of gate dielectric layers 54, and fill the remaining portions of the trenches 33 left by the removed dummy gate stacks. The sub-layers in gate electrodes 56 are not shown separately in FIG. 9A, while in reality, the sub-layers are distinguishable from each other due to the difference in their compositions. The deposition of at least lower sub-layers may be performed using conformal deposition methods such as ALD or CVD, so that the thickness of the vertical portions and the thickness of the horizontal portions of gate electrodes 56 (and each of sub-layers) are substantially equal to each other.

Gate electrodes 56 may include a plurality of layers including, and not limited to, a Titanium Silicon Nitride (TSN) layer, a tantalum nitride (TiN) layer, a titanium nitride (TaN) layer, a titanium aluminum (TiAl) layer, an additional TiN and/or TaN layer, and a filling metal. Some of these layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include aluminum, copper, or cobalt.

FIG. 9B illustrates the cross-sectional view of an exemplary metal gate stack 60. The cross-sectional view is obtained from the vertical plane containing A-A as shown in FIG. 9A. Since the cross-sectional view is obtained from the plane crossing STI regions 22 rather than protruding fins 24', the above-discussed IL is not present in the cross-sectional view. Rather, high-k dielectric layer 52 contacts the top surface of STI region 22. In accordance with some exemplary embodiment, gate electrode 56 includes TSN layer 56-1, TaN layer 56-2, TiN layer 56-3, TiAl layer 56-4, TiN layer 56-5, and filling metal 56-6. It will be appreciated that this layer stack is an example, and metal stacks having different structures may be adopted. Gate stack 60 also includes footing portions 60', which are resulted due to the existence of footing regions 30' in dummy gate stacks 30 (FIG. 6B). It is shown that footing portions 60' include high-k dielectric layer 52 and possibly some metal layers such as TSN, TaN, and/or TiN layers. Footing portions 60' are directly underlying, and are overlapped by, portions of gate spacers 38. Likewise, remnant portions 31 of original dummy gate stack 30 are illustrated in FIG. 9B, although it is recognized that portions of remnant portions 31 might be remove or otherwise altered during the steps of forming replacement gate 60.

Further processing will be apparent to those skilled in the art when informed by the present disclosure and may include forming one or more contact structures contacting gate 60 and source/drain regions 42, forming one or more layers of electrical interconnection above the transistor, and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

One general aspect of embodiments disclosed herein includes a method of forming a dummy gate and an adjacent structure. The method also includes using a directional etch, removing some but not all of the dummy gate to form a trench, where a portion of the dummy gate remains and protects the adjacent structure. The method also includes and forming a gate electrode in the trench.

Another general aspect of embodiments disclosed herein includes a method including forming a fin extending from a semiconductor substrate. The method also includes depositing over the fin a dummy gate material. The method also includes patterning the dummy gate material to form a dummy gate extending over a top of the fin and along sidewalls of the fin. The method also includes depositing a spacer material on the dummy gate and patterning the spacer material to form spacers on respective sidewalls of the dummy gate. The method also includes using the dummy gate and spacers as a mask, etching portions of the fin to form fin recesses. The method also includes filling respective fin recesses with source/drain regions. The method also includes depositing a dielectric layer to surround the dummy gate, the source/drain regions, and the fin. The method also includes isotropically etching the dummy gate to remove a top portion of the dummy gate and to leave a bottom portion of the dummy gate. The method also includes anisotropically etching the bottom portion of the dummy gate to partially remove the bottom portion of the dummy gate and to leave a remnant portion of the dummy gate. The method also includes forming on the remnant portion of the dummy gate a metal gate electrode.

Yet another general aspect of embodiments disclosed herein includes a device including a fin extending upwards from a substrate. The device also includes an isolation material formed over the fin. The device also includes a gate, including a gate dielectric, within a trench in the isolation material, the gate extending over a top and sidewalls of the fin. The device also includes a polysilicon material extending along a bottom portion of the trench, the polysilicon material being interjacent the gate dielectric and the substrate.

From another perspective, embodiments disclosed herein include a transistor having a fin extending from a substrate. The transistor also includes a dielectric material formed over the fin. The transistor also includes a metal gate, including a gate dielectric, within a trench in the dielectric material, the metal gate extending over a top and sidewalls of the fin. The transistor also includes a dummy gate remnant extending along a bottom portion of the trench, the dummy gate remnant being interjacent the gate dielectric and the substrate and extending in a direction perpendicular to the major surface of the substrate.

From yet another perspective, embodiments disclosed herein include a transistor having a fin extending from a substrate. The transistor includes a source/drain region extending from the fin. The transistor also includes a gate dielectric extending over the fin. The transistor also includes a multi-layer metal gate electrode extending over the gate dielectric, the multi-layer metal gate electrode including a cross-section shape having a first portion having substantially vertical sidewalls and a footing portion where the sidewalls widen outwards. The transistor also includes a dummy gate remnant extending from a sidewall of the multi-layer metal gate electrode to a sidewall of the source/drain region, when viewed from a top-down perspective.

From still another perspective, embodiments disclosed herein include a method of forming a transistor including forming a dummy gate over a substrate structure. The method also includes forming spacers on respective sidewalls of the dummy gate. The method also includes forming a source region and a drain region, respectively, on opposing sides of the dummy gate, and depositing a dielectric layer to surround the dummy gate, the source region and the drain region. The method also includes isotropically etching the dummy gate to remove a top portion of the dummy gate and to leave a bottom portion of the dummy gate, and includes anisotropically etching the bottom portion of the dummy gate to partially remove the bottom portion of the dummy gate and to leave a remnant portion of the dummy gate. The method also includes forming on the remnant portion, a metal gate, where the remnant portion extends from a sidewall of the metal gate electrode to a sidewall of the source region when viewed in top-down perspective.

One general aspect of embodiments described herein provides for a device that includes a fin extending upwards from a substrate. The device also includes an isolation material at least partially surrounding the fin. The device also includes a metal gate electrode and gate dielectric extending over a top and sidewalls of the fin. The device further includes a polysilicon material extending along respective bottom portions of sidewalls of the metal gate electrode, the polysilicon material being interjacent the gate dielectric and the substrate in a direction perpendicular to the major surface of the substrate.

Another general aspect of embodiments described herein provides for a device that includes a fin formed on a substrate and having disposed therein a source region and a drain region, respectively, and a dielectric layer at least partially surrounding the fin, including the source region and the drain region, The device further includes a metal gate electrode, extending over the fin, between the source region and the drain region, and a polysilicon remnant extending from a sidewall of the metal gate electrode to a sidewall of the source region when viewed in top-down perspective.

Yet another general aspect of embodiments disclosed herein provides for a method for forming a device, which method includes forming over a fin structure a polysilicon layer, the fin structure having a longitudinal axis in a first direction, and etching the polysilicon layer to form a dummy gate, where the dummy gate has an upper portion with a nominal width, measured in the first direction, and the dummy gate further has a lower portion that flares out to a second width, measured in the first direction, wider than the nominal width. The method further includes forming an insulating material around the dummy gate, removing the upper portion of the dummy gate to form a trench in the insulating material while leaving the lower portion of the dummy gate in place, and forming over the lower portion of the dummy gate a metal gate electrode.

What is claimed is:

1. A device comprising:
a fin extending upwards from a substrate;
an isolation material at least partially surrounding the fin;
a metal gate electrode and gate dielectric extending over a top and sidewalls of the fin; and
a polysilicon material extending along respective bottom portions of sidewalls of the metal gate electrode, the polysilicon material being interjacent the gate dielectric and the substrate in a direction perpendicular to the major surface of the substrate.

2. The device of claim 1, wherein the polysilicon material flares outward from a sidewall of the metal gate electrode when viewed in top down perspective.

3. The device of claim 1, wherein the metal gate electrode has a cross-section shape having a first portion having substantially vertical sidewalls and a footing portion wherein the sidewalls widen outwards.

4. The device of claim 1, wherein the polysilicon material also comprises silicon oxide.

5. The device of claim 1, further comprising a source/drain region at least partially within the fin.

6. The device of claim 5, wherein the polysilicon material extends from a sidewall of the metal gate electrode to a sidewall of the source/drain region, when viewed from a top-down perspective.

7. The device of claim 1, wherein the polysilicon material electrically insulates the metal gate electrode from adjacent conductive structures.

8. The device of claim 1, wherein the polysilicon material is confined to a bottom region of a trench in which the metal gate electrode is formed.

9. A device comprising:
a fin formed on a substrate and having disposed therein a source region and a drain region, respectively;
a dielectric layer at least partially surrounding the fin, including the source region and the drain region;
a metal gate electrode, extending over the fin, between the source region and the drain region; and
a polysilicon remnant extending from a sidewall of the metal gate electrode to a sidewall of the source region when viewed in top-down perspective.

10. The device of claim 9, wherein the polysilicon remnant also includes silicon oxide.

11. The device of claim 9, wherein the polysilicon remnant insulates the metal gate electrode from the source region and the drain region.

12. The device of claim 9, wherein the polysilicon remnant has a triangular shape when viewed in cross-section.

13. The device of claim 9, wherein the polysilicon remnant has a triangular shape when viewed in top-down view.

14. The device of claim 9, wherein the polysilicon remnant extends in a direction perpendicular to the major surface of the substrate.

15. The device of claim 9, wherein the polysilicon remnant extends in a direction parallel to a longitudinal axis of the fin.

16. The device of claim 9, wherein the metal gate electrode is formed in a trench in the dielectric layer, and wherein polysilicon remnant extends from a first sidewall of the trench to a second sidewall of the trench.

17. The device of claim 16, wherein the polysilicon remnant is confined to bottom corners of the trench.

18. A method of forming a device, the method comprising:

forming over a fin structure a polysilicon layer, the fin structure having a longitudinal axis in a first direction;

etching the polysilicon layer to form a dummy gate, wherein the dummy gate has an upper portion with a nominal width, measured in the first direction, and the dummy gate further has a lower portion that flares out to a second width, measured in the first direction, wider than the nominal width;

forming an insulating material around the dummy gate;

removing the upper portion of the dummy gate to form a trench in the insulating material while leaving the lower portion of the dummy gate in place; and forming over the lower portion of the dummy gate a metal gate electrode.

19. The method of claim 18, further comprising forming spacer layers around the dummy gate prior to the step of removing the upper portion of the dummy gate 30 to form a trench.

20. The method of claim 19, wherein the metal gate electrode is deposited in the trench in the insulating material.

* * * * *